United States Patent [19]

LePage

[11] Patent Number: 4,970,461
[45] Date of Patent: Nov. 13, 1990

[54] METHOD AND APPARATUS FOR NON-CONTACT OPENS/SHORTS TESTING OF ELECTRICAL CIRCUITS

[76] Inventor: Andrew J. LePage, 1500 Skyline Drive Extension, Apt. #6, Lowell, Mass. 01854

[21] Appl. No.: 371,589

[22] Filed: Jun. 26, 1989

[51] Int. Cl.⁵ .................... G01R 31/00; G01R 31/02
[52] U.S. Cl. ..................... 324/158 F; 324/158 R; 324/158 P
[58] Field of Search ............... 324/72.5, 62, 71.1, 324/71.3, 158 R, 158 D, 158 T, 158 F, 158 P; 250/484.1; 437/8

[56] References Cited

U.S. PATENT DOCUMENTS

| | | | |
|---|---|---|---|
| 3,436,651 | 4/1969 | Helms et al. | 324/501 |
| 3,549,999 | 12/1970 | Norton | 324/501 |
| 3,763,425 | 10/1973 | Engelke | 324/501 |
| 3,764,898 | 10/1973 | Bohlen et al. | 324/501 |
| 3,772,520 | 11/1973 | Varker | 324/537 |
| 3,796,947 | 3/1974 | Harrod et al. | 324/158 P |
| 4,169,244 | 9/1979 | Plows | 324/537 |
| 4,415,851 | 11/1983 | Langner et al. | 324/501 |
| 4,417,203 | 11/1983 | Pfeiffer et al. | 324/501 |
| 4,426,619 | 1/1984 | Demond | 324/158 F |
| 4,507,605 | 3/1985 | Geisel | 324/537 |
| 4,527,119 | 7/1985 | Rogers et al. | 33/1 M |
| 4,573,003 | 2/1986 | Lischke | 324/158 R |
| 4,578,279 | 3/1986 | Zingher | 324/501 |
| 4,733,176 | 3/1988 | Feuerbaum | 324/158 R |
| 4,771,230 | 9/1988 | Zeh | 324/158 F |
| 4,843,329 | 6/1989 | Beha et al. | 324/158 R |
| 4,845,425 | 7/1989 | Beha et al. | 324/158 R |

Primary Examiner—Reinhard J. Eisenzopf
Assistant Examiner—W. Burns

[57] ABSTRACT

A circuit is tested for unwanted shorts and opens by positioning the circuit between a pair of electrodes in a chamber filled with an inert gas with the circuit conductors facing one of the electrodes. The circuit is charged by applying a selected voltage to the electrodes to produce an electric field extending generally perpendicular to the circuit, the voltage polarity being such that the one electrode carries the negative electrical charge. The circuit is then subjected to a pulsed laser beam brought to a focus between the one electrode and a selected spot on a conductor of the circuit so as to ionize the chamber gas at the beam focus to form a plasma so that an electric charge is imparted to that spot and to other circuit conductor portions having electrical continuity with that spot. The circuit is then discharged by reversing the polarity of the applied voltage and increasing the voltage magnitude substantially to the breakdown voltage of the chamber gas so as to form a glowing discharge plasma in the chamber gas opposite the charged portions of the circuit conductors. The circuit is observed to determine which portions of its conductors are glowing and therefore have electrical continuity with the selected conductor spot and which portions are not.

14 Claims, 2 Drawing Sheets

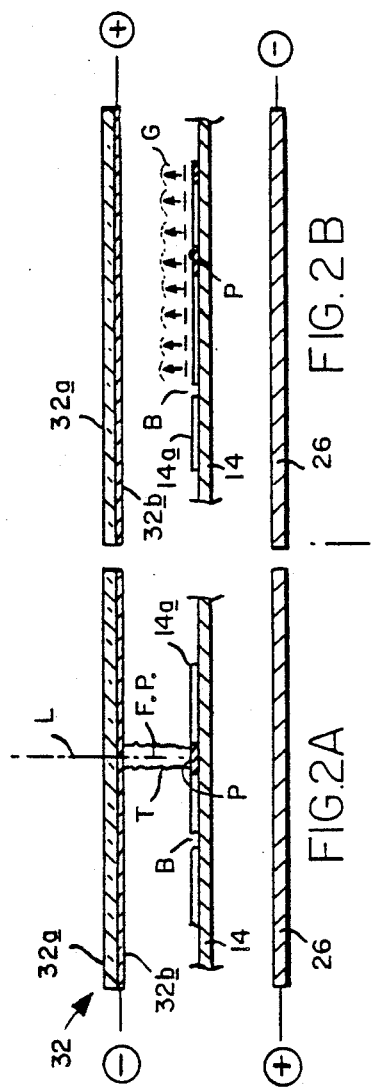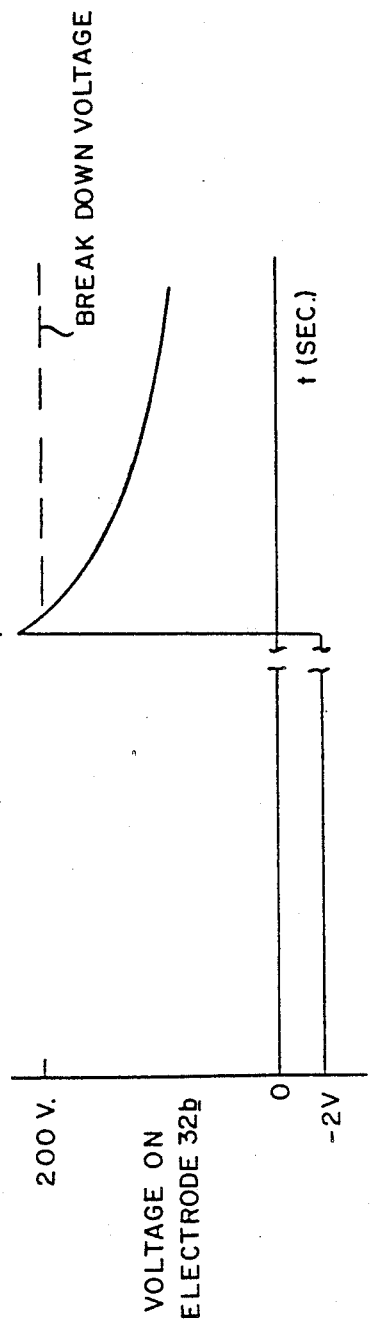

METHOD AND APPARATUS FOR NON-CONTACT OPENS/SHORTS TESTING OF ELECTRICAL CIRCUITS

This invention relates to a method and apparatus for testing electrical conductor continuity and isolation (i.e. shorts and opens) in circuit boards, such as printed wiring boards, printed circuits, and the like. It relates more particularly to a test cell for contactless testing for opens and shorts using a laser-induced plasma.

BACKGROUND OF THE INVENTION

The usual printed wiring boards, ceramic substrates, printed circuits and the like include a multiplicity of conductive paths or lines of etch which are connected selectively and which lie in relatively complex patterns on a non-conductive rigid or flexible substrate. Prior to connecting the various IC chips, resistors, capacitors, etc. to the circuit, it is desirable to test the various electrical conductors of the circuit so that circuit faults such as opens and shorts can be discovered and corrected before those circuit components are added to the board or circuit.

It has long been the practice to test such circuits by placing the circuit in a fixture and bringing "bed of nails" test probes into contact with the various circuit conductors or lines of etch. Once in contact, the continuity between various probes is measured using well known electrical instrumentation. However, as the wiring densities of such circuits has increased over the years, the conductor widths and pad sizes have decreased commensurately. Resultantly, it has become more and more difficult to use such mechanical testing means because of the need for finer and finer probes and more accurate motion systems for positioning the probes relative to the circuit being tested. In addition, there is a greater propensity for damaging finer conductors and probes during the test.

To meet these more stringent testing requirements, various techniques have been developed to reduce or eliminate entirely physical contact with the printed circuits during the performing of such tests. One known technique uses an electron beam. One end of a conductor in the circuit is bombarded with an electron beam and brought to a predetermined potential by secondary electron emission so that between the two ends of the conductor, there is a potential difference resulting in current flow along the conductor provided there is no break in the conductor. The prior art is repleat with testing systems using this principal which provide clear discrimination between uninterrupted and interrupted conductors as well as detection of shorted conductors in printed wiring boards, printed circuits, VLSI packaging substrates and other microcircuitry. However, contactless testing using an electron beam does have some disadvantages. Some such systems require individually controlled electron beams which must simultaneously address both ends of the conductor under test. Some electron beam test systems require relatively complex masks which make difficult the loading and unloading of specimens.

There is also a known non-contact method of testing electrical conductors in which a single mechanical probe stimulates a conductor of a circuit placed in a low pressure inert atmosphere. This stimulation causes the conductor and all the lines and runs connected electrically to that conductor to glow. This glow is then observed using a scanning photometer. In this way, an entire network can be checked with the use of a single mechanical probe thereby minimizing the contact between the probe and the circuit under test. This prior testing technique is disadvantaged in that it does require at least some physical contact between the test instrument and the circuit under test.

There is also a known fault testing technique using a laser for achieving an electrical connection between a probe and a circuit under test without there being any physical contact between the probe and the circuit conductors. In this arrangement, a laser produces a plasma that electrically connects the probe positioned above the circuit under test to the underlying circuit conductor. However, a mechanical connection is still needed to electrically connect the plasma "probe" to the necessary instrumentation to determine whether or not there is a circuit fault.

SUMMARY OF THE INVENTION

Bearing in mind the difficiencies of the prior art as described above, the present invention relates to improved method and apparatus for non-contact testing for open circuits and short circuits in circuit boards, such as printed circuits, wiring boards, ceramic substrates, electrical networks and the like. The apparatus can be implemented as a fully automated testing system Which can detect opens and shorts in a minimum amount of time. Indeed, it can test an entire electrical network in "one shot" thereby maximizing tester efficiency. Still, the apparatus minimizes the likelihood of damage to the circuit under test due to physical contact.

The invention accordingly comprises the several steps and the relation of one or more of such steps with respect to each of the others and the apparatus embodying the features of construction, combination of elements and arrangement of parts which will be exemplified in the following detailed description, and the scope of the invention will be indicated in the claims.

Briefly, in accordance with this invention, the circuit board or circuit to be tested is positioned in an inert gas atmosphere between a pair of electrodes extending generally parallel to the plane of the circuit. The electrode opposite the circuit conductors is transparent to light from a pulsed laser positioned opposite the transparent electrode. The actual testing of the circuit may be performed in two phases, namely, a charge phase and a discharge phase. During charging, a potential difference of a few volts may be established between the electrodes, with the transparent electrode carrying the negative charge. Then the laser is preferably pulsed briefly with the laser beam coming into focus between the transparent electrode and a selected spot on the circuit conductor or line of etch to be tested. The gas at the focus of the beam ionizes as a result of multiphoton absorption and, desirably also, a cascade effect. Resultantly, a plasma form at the focus, and under the influence of the applied electric field, diffuses to electrically connect the transparent electrode and the selected spot on the circuit conductor. A current then flows briefly to the conductor thus imparting an electric charge to all conductor runs connected electrically to the conductor spot imaged by the laser. Conductor portions that do not have continuity with that spot will not be so charged. This plasma may persist for a few microseconds after cessation of the laser pulse.

As soon as the laser pulse has ended, the apparatus may be switched to its discharge phase. For this, the polarity of the voltage applied to the electrodes is reversed and the voltage increased to the breakdown voltage of the inert gas surrounding the circuit under test. This voltage depends on the particular gas and may range from, say, 100 to 500 volts. Once the breakdown voltage is reached, a discharge plasma forms along the previously charged portions or runs of the conductor as a result of electrons jumping from the charged portions of the conductor and exciting the inert gas above those portions. Resultantly, all of the conductor runs of the circuit connected electrically to the conductor spot that was imaged by the laser beam emit light or glow due to electroluminescence. Thus, by observing which circuit conductor runs emit light, one can determine whether or not those runs are connected electrically to the conductor spot exposed to the laser beam.

The discharge glow can be detected automatically by a camera, photometer or other conventional light detecting device. Also, selected points on the circuit can be sampled using a scanning photometer, for example, to determine whether or not those points emit light. These test results can then be compared to a reference sample representing the desired continuity condition for that circuit. If there is a match, then the circuit may be deemed to have passed the test. If there is no match, the circuit can be said to have failed the test. The particular point or points where the mismatch occurs indicates the location and type of failure, i.e. an open circuit or short circuit.

If as is usually the case, a particular circuit board contains several independent or isolated circuit paths or runs, then each individual path or run may be charged and discharged as described above to fully test the circuit.

Thus, the present apparatus performs basic opens/shorts testing in a manner that requires no physical contact with the circuit under test thereby substantially minimizing or eliminating entirely circuit damage due to the test. Also, since the instrumentation used to observe the discharge glow can be arranged to simultaneously observe many points along or near the conductor or line of etch to be tested, an entire network can be tested on a "one shot" basis. This substantially increases testing speed since much of the testing time is taken up to locate and change a conductor or line of etch. Accordingly, this non-contact testing technique should find wide application wherever it is necessary to test the conductor paths of circuit boards, such as printed circuits, printed wiring boards, ceramic substrates, and the like for opens and shorts.

BRIEF DESCRIPTION OF THE DRAWINGS

In the accompanying drawings:

FIGS. 2A and 2B are sectional views taken along line 2—2 of FIG. 1 illustrating the operation of the apparatus; and FIGS. 3A and 3B are diagrammatic views that help to explain the operation of the FIG. 1 apparatus.

DESCRIPTION OF THE PREFERRED EMBODIMENT

Figure 1:
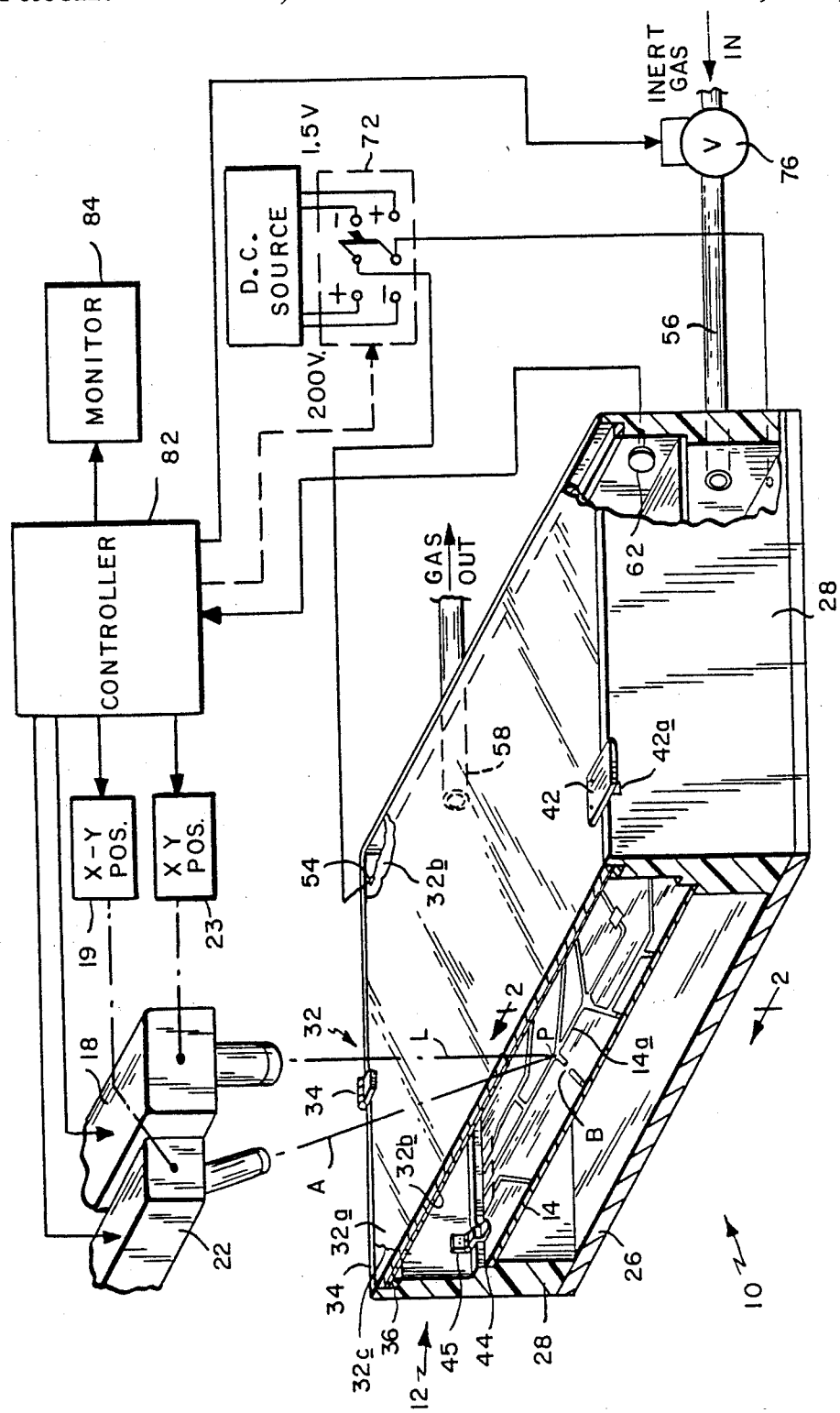
FIG. 1 is a diagrammatic view with parts broken away showing apparatus for non-contact testing according to this invention.

Referring to FIG. 1 of the drawings, the test apparatus, shown generally at 10, includes a fluid-tight chamber 12 for housing a circuit board or circuit 14 to be tested. Chamber 12 is positioned directly opposite the working end of a laser 18 which may be supported by a suitable XY positioning device 19 so that the laser can direct a coherent beam of light L to selected points or spots P on the conductors or lines of etch 14a of the printed circuit 14 in chamber 12.

Also positioned opposite chamber 12 is a light detector 22 which may be a photometer, CCD or videcon camera, image dissection tube or the like, which is able to detect light emanating from the circuit 14 under test. Preferably, the detector 22 is also mounted to an XY positioning device 23 so that it can be moved relative to chamber 12 and the printed circuit therein.

Chamber 12 includes an electrically conductive bottom wall 26, which functions as an electrode, four non-conductive side walls 28 and a top wall or cover 32 which can be removed to gain access to the interior of the chamber for positioning a circuit board or circuit 14 therein. In the illustrated chamber embodiment, cover 32 is hinged as at 34 to a side wall 28 so that the cover can be swung between open and closed positions. Appropriate seals or gaskets 36 may be provided all around the tops of side walls 28 so that when the cover 32 is in its closed position, a hermetic seal is provided between the cover and side walls 28. Also, a handle/latch 42 may be mounted to the top of cover 32 which can engage a detent 42a on the underlying side wall 28 to facilitate lifting the cover and locking the cover in its closed and sealed position.

Still referring to FIG. 1, the circuit 14 may be supported within cell 12 by ledges or brackets 44 projecting inwardly from the cell side walls 28 so that the circuit is supported in an image plane that is parallel to the bottom wall 26 and also parallel to the cover 32 when that cover is in its closed position. Suitable spring-loaded latches 45 may be positioned around the ledges to releasably lock the circuit in place.

In accordance with this invention, the cell top wall or cover 32 is electrically conductive as well as transparent to the light emanating from laser 18. More particularly, that cover may include a rigid transparent glass layer 32a whose underside or inner surface is covered by a transparent, electrically conductive film or coating 32b of gold or other inert metal which functions as an electrode. Preferably also, an antireflective coating 32c is applied to the upper or outer surface of cover 32. As an alternative, a fine wire grid could also be used as the transparent electrode.

In order to purge and fill chamber 12 with an inert gas, a pair of pipes 56 and 58 extend through the right-hand side wall 28 preferably at diagonally opposite corners thereof. Pipe 56 may be connected by way of a controllable valve 76 to a source of inert gas such as argon or neon, for example. The other pipe 58 leads to a negative pressure source so that the chamber can be purged of air and gas. Preferably, a pressure sensor 62 is provided inside chamber 12 for sensing the gas pressure inside the chamber and developing a corresponding electrical signal.

As seen in FIG. 1, the bottom wall electrode 26 and the top electrode 32b may be connected electrically by way of a two-way switch 72 to a source 74 of dc potential.

The operation of laser 18, light detector 22, switch 72 and valve 76 may be controlled by a controller 82 which also controls the positioning devices 19 and 23 which position laser 18 and detector 22. The controller may also monitor the output of the pressure sensor 62 and control valve 76 in accordance therewith to maintain a selected inert gas pressure inside the chamber 12 during each test. The results of each test may be displayed of a monitor 84.

To test the printed circuit 14 for opens and shorts, the circuit may be placed in chamber 12 and positioned on the supporting ledges 44 inside the chamber. After the chamber cover 32 is closed and the handle/latch 42 moved to its locked position to seal the circuit inside the chamber, controller 82 may be activated to initiate the test. First, the controller opens the valve 76 and activates the vacuum source (not shown) at pipe 58 so that the chamber 12 is purged of air and filled with an inert gas, e.g. argon at a selected relatively low pressure, e.g. 100 Torrs. The controller 82 samples the outputs of the pressure sensor 62 inside chamber 12 and controllable valve 76 as needed to maintain the desired internal pressure.

The actual testing of the circuit 14 may be performed by apparatus 10 in two phases, namely, a charge phase and a discharge phase. Referring to FIGS. 2A and 3A, first controller 82 positions laser 18 so that its beam of light can image a selected spot or point on a conductor 14a of circuit 14, e.g. spot P in FIG. 1. Then the controller controls switch 72 so as to apply a small potential difference, typically in the range of 1 to 5 volts, e.g. 2 volts, between the electrodes 26 and 32b, with electrode 32b carrying the negative charge as shown in FIG. 3A. Next, controller 82 activates laser 18 so that the laser emits a pulse of coherent light L, with the light beam being brought to a focus at a focal point FP inside cell 12 between the upper electrode 32b and the conductor 14a at spot P. The inert gas at the focus of the beam ionizes as a result of multiphoton absorption and, depending upon the gas pressure in chamber 12, a cascading effect. As a result, a plasma forms quickly at the focal point FP and, under the influence of the applied electric field, diffuses to form a plasma "tube" T that electrically connects the conductor spot P and the electrode 32b. Upon formation of the tube T, a current flows briefly to the conductor spot P thus imparting an electric charge to that spot and to all of the conductor portions or runs having electrical continuity with that spot on the conductor 14a. On the other hand, conductor runs separated from spot P by a break or crack B receive no charge. One such isolated run is shown in FIG. 2A to the left of break B in a conductor 14a.

A few microseconds after the laser pulse has ended, the plasma tube dissipates and the conductor charging ceases. The energy per laser pulse required for plasma formation is dependent upon the gas used in chamber 12, the pressure of that gas, the wavelength of the light emitted from laser 18 and the cross section of the laser beam at the focal point FP. As an example, a laser operating at a wavelength of one micron with a pulse length of twenty nanoseconds and a laser beam focal spot 5 mils in diameter in an argon atmosphere at 100 Torrs requires an energy of about one joule per pulse per plasma formation.

After the circuit conductor 14a has been charged at point P as aforesaid, the apparatus 10 may be switched immediately to its discharge mode of operation. More particularly, controller 82 may switch switch 72 so that a relatively high voltage of the opposite polarity is applied to electrodes 26 and 32b. As shown in FIG. 3B, this voltage should exceed the breakdown voltage of the gas in chamber 12, e.g. 200 volts for argon gas, and have a shaped waveform to control the discharge from conductor 14a. Once the break-down voltage of the chamber gas is reached, electrons are emitted from the previously charged conductor 14a as shown by the small vertical arrows in FIG. 2B. These electrons excite the gas around the charged conductor creating glowing discharge plasma G, shown in FIG. 2B, along all of the runs and branches of the conductor 14a that were previously charged and therefore connected electrically, by desire or due to shorts, to the conductor spot P imaged by the laser beam during the charge phase of the test. On the other hand, those runs or portions of the conductor 14a that did not have electrical continuity with conductor spot P because of a break or crack B and therefore were not so charged are not "tagged" or identified by the glowing plasma discharge G. One such non-glowing conductor run is shown in FIG. 2B to the left of break B.

Simultaneous with the application of the high voltage field, controller 82 may control detector 22 so that the detector scans the circuit and samples the light emanating from selected points on the circuit to produce an electronic "map" which indicates which of the sampled points glow and which do not. This information can then be compared with a reference map stored in the detector or in the controller 82 to identify the sites of unwanted open circuits and/or short circuits in the circuit 14. The test results can then be displayed in any desirable format on the monitor 84. Instrumentation for accomplishing this is disclosed, for example, in U.S. Pat. No. 4,507,605.

Instead of scanning circuit board 14 to find faults, a camera may be used to take a snapshot of circuit board 14 from above or, in some cases, an operator can find a fault on the board simply by observing which segments of the circuit glow and which do not.

It will be seen from the foregoing that apparatus 10 enables the testing for opens and shorts of printed wiring boards, printed circuits and the like in a manner that requires no physical contact with the board or circuit and which, therefore, minimizes or substantiallY eliminates the potential for damage to those circuits due to the tests. In addition, the detector 22 and associated instrumentation can be arranged to observe many points along or near the conductor or line of etch being tested. Accordingly, an entire network can be tested all at once thereby minimizing test set up time and maximizing tester efficiency.

Certain changes may be made in carrying out the above method and in the construction set forth without departing from the scope of the invention. For example, for two-sided testing applications, the chamber 12 bottom wall 26, instead of being a metal plate, can be made identical to the top wall or cover 32 and an additional laser and detector can be mounted in relation to bottom wall 26 in the same manner that laser 18 and detector 22 are mounted in relation to top wall 32. Further, the power plane of circuit 14 under test may be utilized as an electrode. Therefore, it is intended that all matter contained in the above description or shown in the accompanying drawings shall be interpreted as illustrative and not in a limiting sense.

It should also be understood that the following claims are intended to cover all of the generic and specific features of the invention herein described.

I claim:

1. A method of non-contact testing a circuit having one or more conductors for unwanted shorts and opens, said method comprising the steps of positioning the circuit between a pair of electrodes in a chamber filled with a selected gas, the circuit conductors facing one of the electrodes;

charging the circuit by applying a selected voltage to the electrodes to produce an electric field extending generally perpendicular to the circuit, the voltage polarity being such that said one electrode carries a negative electric charge, and subjecting the circuit to a pulsed laser beam brought to a focus between said one electrode and a selected spot on a circuit conductor so as to ionize the chamber gas at the beam focus to form a plasma which, under the applied field in the chamber, diffuses and creates a conductive path extending between said conductor spot and said one electrode so that an electric charge is imparted to said spot and other circuit conductor runs having electrical continuity with said spot;

discharging the circuit by reversing the polarity of the applied voltage and increasing the voltage magnitude substantially to the breakdown voltage of the chamber gas thereby forming a glowing discharge plasma in the chamber gas opposite the charged portions of the circuit conductors; and observing the circuit to determine which portions of the conductors are glowing and thus have electrical continuity with the selected conductor spot and which portions are not.

2. The method of testing defined in claim 1 wherein the a circuit is observed by scanning the circuit and sampling points on and near the conductors to develop a test profile for the circuit; and comparing the test profile with a reference profile to determine whether or not the circuit passes the test.

3. A method of non-contact testing a circuit board having one or more conductors for unwanted shorts end opens, said method comprising the steps of:

positioning the circuit board between a pair of electrodes in a chamber filled with a selected gas with the circuit conductors facing one of the electrodes;

charging the circuit board by applying a selected voltage to the electrodes to produce an electric field extending generally perpendicular to the circuit board, the voltage polarity being such that said one electrode carries the negative electrical charge, and subjecting the circuit board to a pulsed laser beam brought to a focus between said one electrode and a selected spot on a conductor of the circuit board so as to ionize the chamber gas at the beam focus to form a plasma so that an electric charge is imparted to said spot and other circuit conductor portions having electrical continuity with that spot;

discharging the circuit board by reversing the polarity of the applied voltage and increasing the voltage magnitude substantially to the breakdown voltage of the chamber gas so as to form a glowing discharge plasma in the chamber gas opposite the charged portions of the circuit conductors; and observing the circuit board to determine which portions of its conductors are glowing and therefore have electrical continuity with the selected conductor spot and which portions are not.

4. The method of testing defined in claim 3 wherein the chamber is filled with an inert gas.

5. The method of testing defined in claim 4 wherein the inert gas is argon.

6. The method of testing defined in claim 3 and including the additional step of controlling the pressure of the chamber gas so that it is maintained at a selected relatively low pressure.

7. The method of testing defined in claim 3 wherein during the charging step a voltage of 1 to 5 volts is applied to the electrodes.

8. The method of testing defined in claim 3 wherein during the discharge step, a voltage of 100 to 500 volts is applied to the electrodes.

9. Apparatus for non-contact testing a circuit having one or more conductors for unwanted shorts and opens, said apparatus comprising a chamber for housing the circuit;

means for filling the chamber with an inert gas;

a pair of planar electrodes positioned in said chamber, said electrodes being spaced parallel to one another;

means for positioning a circuit in said chamber at an imaging plane between and substantially parallel to said electrodes;

means for applying a selected voltage to the electrodes to produce an electric field extending generally perpendicular to said imaging plane, the voltage polarity being such that one electrode opposite the circuit conductors carries the negative electric charge;

a laser whose beam is brought to a focus between said one electrode and a selected spot on a conductor of a circuit in said imaging plane so as to ionize the chamber gas at the beam focus to form a plasma which conducts electric charge to said selected conductor spot and other circuit conductor portions in continuity with said spot;

means for reversing the polarity of the applied voltage and increasing the voltage magnitude substantially to the breakdown voltage of the chamber gas thereby to form a glowing discharge plasma in the chamber gas opposite the charged portions of the conductors of the circuit in said imaging plane; and means for observing a circuit in said imaging plane to determine which portions of its conductors are glowing and thus in electrical continuity with said selected conductor spot and which portions are not.

10. The apparatus defined in claim 9 wherein said one electrode and the wall of said chamber opposite said one electrode are transparent to the light emitted by said laser; and said laser is positioned outside said chamber and images a circuit in said plane through said one electrode.

11. The apparatus defined in claim 9 and further including means for controlling the pressure of the gas inside said chamber.

12. The apparatus defined in claim 11 wherein the pressure controlling means includes a pressure sensor positioned inside said chamber.

13. The apparatus defined in claim 9 wherein said laser is a pulsed laser.

14. The apparatus defined in claim 9 wherein said observing means comprise a light detector selected from the group consisting of photometer, CCD camera and image dissection tube.

* * * * *